(12) United States Patent
Yang et al.

(10) Patent No.: US 9,282,614 B2
(45) Date of Patent: Mar. 8, 2016

(54) ELECTRONIC DEVICE AND FABRICATING METHOD OF DISPLAY MODULE OF ELECTRONIC DEVICE

(71) Applicant: HTC Corporation, Taoyuan County (TW)

(72) Inventors: Syuan-Ling Yang, Taoyuan County (TW); Chih-Jen Hu, Taoyuan County (TW)

(73) Assignee: HTC CORPORATION, Taoyuan (TW)

( * ) Notice: Subject to any disclaimer, the term of this patent is extended or adjusted under 35 U.S.C. 154(b) by 0 days.

(21) Appl. No.: 13/778,133

(22) Filed: Feb. 27, 2013

(65) Prior Publication Data

US 2014/0239801 A1     Aug. 28, 2014

(51) Int. Cl.
| | |
|---|---|
| *H01J 1/62* | (2006.01) |
| *H01J 63/04* | (2006.01) |
| *H05B 33/10* | (2006.01) |
| *H01L 51/52* | (2006.01) |
| *H05B 33/04* | (2006.01) |

(52) U.S. Cl.
CPC ............ *H05B 33/10* (2013.01); *H01L 51/5237* (2013.01); *H01L 51/5243* (2013.01); *H01L 51/5253* (2013.01); *H01L 51/5256* (2013.01); *H05B 33/04* (2013.01); *H01L 51/5246* (2013.01); *H01L 51/5281* (2013.01); *H01L 2251/5338* (2013.01)

(58) Field of Classification Search
CPC .... H05B 33/00; H05B 33/04; H01L 51/5237; H01L 51/5243; H01L 51/5253; H01L 51/5256; H01L 225/5338; H01L 51/5281; H01L 51/5246

USPC .............. 313/504, 511, 512; 445/24, 25; 361/750, 749, 751
See application file for complete search history.

(56) References Cited

U.S. PATENT DOCUMENTS

| | | | |
|---|---|---|---|
| 7,259,505 B2 | 8/2007 | Cok | |
| 8,053,984 B2 | 11/2011 | Lee et al. | |
| 8,138,669 B2 | 3/2012 | Kim | |
| 2003/0057422 A1* | 3/2003 | Yamazaki et al. | 257/79 |
| 2003/0104850 A1* | 6/2003 | Lai et al. | 455/575 |
| 2004/0000863 A1* | 1/2004 | Miyake | 313/501 |
| 2004/0189196 A1* | 9/2004 | Cok | 313/512 |
| 2006/0017055 A1* | 1/2006 | Cropper | H01L 51/56 257/77 |

(Continued)

FOREIGN PATENT DOCUMENTS

| | | |
|---|---|---|
| CN | 1988206 | 6/2007 |
| TW | 200522772 | 7/2005 |

(Continued)

OTHER PUBLICATIONS

"Office Action of Taiwan Counterpart Application", issued on May 26, 2015, p. 1-p. 11, in which the listed references were cited.

*Primary Examiner* — Bao Q Truong
*Assistant Examiner* — Glenn Zimmerman
(74) *Attorney, Agent, or Firm* — Jianq Chyun IP Office (57) ABSTRACT

A display module and a fabricating method of the display module are provided. The display module includes a transparent cover, a first protection film, and an organic light-emitting display (OLED) device. The OLED device is disposed between the transparent cover and the first protection film. An area of the OLED device is smaller than an area of the transparent cover and an area of the first protection film.

14 Claims, 7 Drawing Sheets

(56) References Cited

U.S. PATENT DOCUMENTS

| | | | |
|---|---|---|---|
| 2007/0145889 A1* | 6/2007 | Tamura et al. | 313/504 |
| 2007/0152213 A1* | 7/2007 | Weaver | 257/40 |
| 2008/0117576 A1* | 5/2008 | Gao et al. | 361/681 |
| 2008/0122802 A1* | 5/2008 | Furuhashi et al. | 345/174 |
| 2008/0129189 A1* | 6/2008 | Cok | 313/503 |
| 2008/0239636 A1* | 10/2008 | Hsu et al. | 361/681 |
| 2009/0026945 A1* | 1/2009 | Boroson et al. | 313/512 |
| 2010/0277684 A1* | 11/2010 | Fukushima et al. | 349/158 |
| 2011/0063808 A1* | 3/2011 | Chen et al. | 361/750 |
| 2012/0162938 A1* | 6/2012 | Kim et al. | 361/750 |
| 2012/0299029 A1* | 11/2012 | Kimura | G02F 1/1339 257/88 |
| 2012/0326397 A1* | 12/2012 | Reed et al. | 277/637 |
| 2013/0335930 A1* | 12/2013 | Noda | H04M 1/0262 361/749 |

FOREIGN PATENT DOCUMENTS

| | | |
|---|---|---|
| TW | 201044899 | 12/2010 |
| TW | 201205733 | 2/2012 |

* cited by examiner

ELECTRONIC DEVICE AND FABRICATING METHOD OF DISPLAY MODULE OF ELECTRONIC DEVICE

BACKGROUND OF THE INVENTION

1. Field of the Invention

The application generally relates to a display module and a fabricating method thereof. More particularly, the application relates to an organic light-emitting display (OLED) module and a fabricating method thereof.

2. Description of Related Art

An organic light-emitting display (OLED) module has great potential applicability and has been extensively applied to various electronic products due to its advantages of high color saturation, slimness, self-luminescence, wide view angle, low power consumption, simple fabrication, low manufacturing costs, low working temperature, fast response speed, full-color display, and so forth. In recent years, digital information and wireless mobile communication technologies have been rapidly developed. The requirements of electronic information products (e.g., mobile phones, personal digital assistants (PDAs), and other digital products) for convenience, miniaturization, and being user-friendly have resulted in the increasing demands for display modules, and such electronic products are more and more prone to utilize the OLED modules as their display modules.

Due to the poor tolerance of the organic material to moisture and oxygen, the existing OLED modules containing said organic material are mostly formed on glass substrates. Nonetheless, in order to isolate moisture and oxygen as well as simplify the assembling process, the thickness and the weight of the glass substrates can barely be reduced. Moreover, when the OLED modules placed on the glass substrates are adhered to the glass covers of electronic apparatuses, the glass is very likely to be broken.

SUMMARY OF THE INVENTION

The application is directed to a display module capable of resolving the issue of the excessive thickness of a conventional organic light-emitting display (OLED) module.

The application is further directed to a fabricating method of a display module capable of resolving the issue of unfavorable yield.

A display module of the application including a transparent cover, a first protection film, and an OLED device is provided. The OLED device is disposed between the transparent cover and the first protection film. An area of the OLED device is smaller than an area of the transparent cover and an area of the first protection film.

A fabricating method of a display module of the application includes steps as follows. An organic light-emitting display (OLED) device is adhered to a transparent cover. A first protection film is adhered to the OLED device. The OLED device is disposed between the transparent cover and the first protection film. An area of the OLED device is smaller than an area of the transparent cover and an area of the first protection film.

In view of the above, according to the display module and the fabricating method thereof as described herein, two sides of the OLED device are protected from moisture and oxygen by means of the cover and the protection film, respectively. Thereby, the thickness and the weight of the OLED device may be reduced, and the manufacturing yield may be ameliorated.

These and other exemplary embodiments, features, aspects, and advantages of the invention will be described and become more apparent from the detailed descriptions of exemplary embodiments when read in conjunction with accompanying drawings.

DESCRIPTION OF THE EMBODIMENTS

Figure 1:
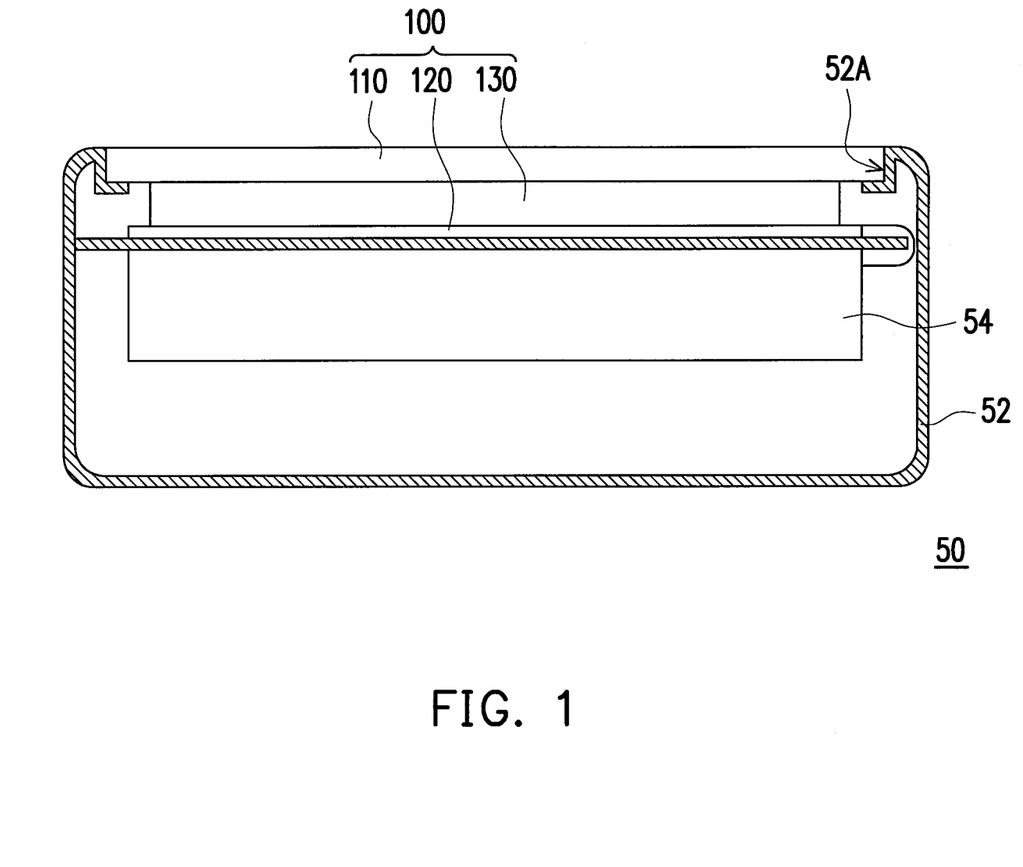
FIG. 1 is a schematic cross-sectional view illustrating a handheld electronic device according to an embodiment of the invention.

FIG. 1 is a schematic cross-sectional view illustrating a handheld electronic device according to an embodiment of the invention. Here, the proportion and dimension of each component have been modified for illustrative purposes. With reference to FIG. 1, the handheld electronic device 50 described in the present embodiment includes a body 52, a host system 54, and a display module 100. The body 52 has a display opening 52A. The host system 54 is disposed in the body 52. The display module 100 is placed in the display opening 52A. The display module 100 includes a transparent cover 110, a first protection film 120, and an organic light-emitting display (OLED) device 130. The OLED device 130 is disposed between the transparent cover 110 and the first protection film 120 and electrically connected to the host system 54. For instance, the OLED device 130 is electrically connected to the host system 54 through a flexible printed circuit board or any other device.

Since the transparent cover 110 and the first protection film 120 are well resistant to moisture and oxygen, both the transparent cover 110 and the first protection film 120 are capable of protecting the OLED device 130 from being damaged by moisture and oxygen. Besides, an area of the OLED device 130 is smaller than an area of the transparent cover 110 and an area of the first protection film 120. This further prevents the OLED device 130 from being damaged by moisture or oxygen and extends the lifespan of the OLED device 130.

In the present embodiment, the transparent cover 110 may be made of glass or any other material, and a touch sensing device may be selectively formed on the transparent cover 110. The first protection film 120 may be metal foil (e.g., aluminum foil or silver foil), and the metal foil has or does not have a plastic substrate. Dense metal and glass are capable of well blocking moisture and oxygen. Besides, given that the first protection film 120 is made of metal foil, the light provided by the OLED device 130 toward the first protection film 120 may be entirely reflected, such that the light utilization rate may be raised. The thickness of the first protection film 120 may range from 50 micrometer to 200 micrometer, e.g., 100 micrometer. Note that the thickness of the first protection film 120 is determined for the convenience of performing an adhesion process.

Other embodiments are given hereinafter for explanation. It should be mentioned that reference numbers and some descriptions provided in the previous embodiment are also applied in the following embodiment. The same reference numbers represent the same or similar components in these embodiments, and repetitive descriptions are omitted. Different features described in each embodiment are basically applicable to other embodiments. The omitted descriptions may be referred to as those described in the previous embodiments.

Figure 2:
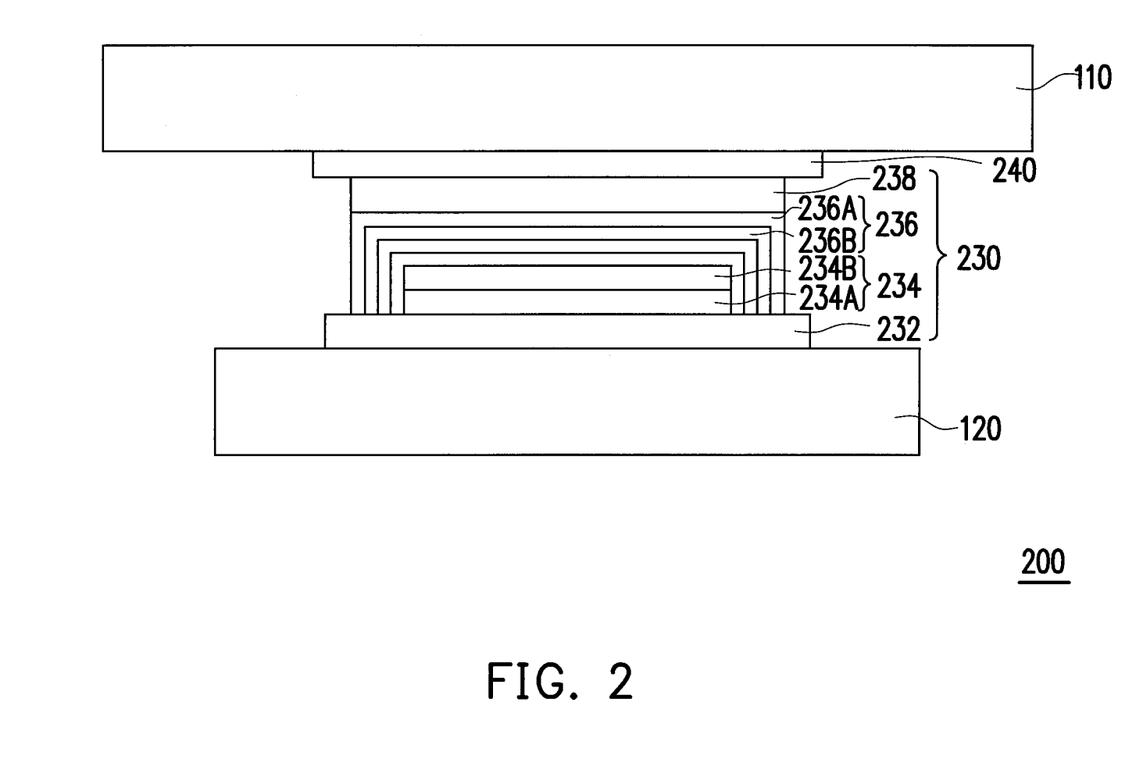
FIG. 2 to FIG. 5 are schematic cross-sectional views illustrating a display module according to four other embodiments of the invention.

FIG. 2 is a schematic cross-sectional view illustrating a display module according to another embodiment of the invention. With reference to FIG. 2, the display module 200 described in the present embodiment is similar to and may replace the display module 100 depicted in FIG. 1, and the display module 200 is applicable to the handheld electronic device 50 as well. Here, the proportion and dimension of each component have been modified for illustrative purposes. The OLED device 230 of the present embodiment includes a flexible substrate 232, an OLED unit 234, and an isolation layer 236. The OLED unit 234 is disposed on the flexible substrate 232, and a distribution area of the OLED unit 234 is smaller than an area of the flexible substrate 232. That is, the OLED unit 234 is not placed on the entire surface of the flexible substrate 232, and peripheral regions on the flexible substrate 232 are not occupied. The isolation layer 236 is disposed on the flexible substrate 232 and completely covers the OLED unit 234. That is, the isolation layer 236 covers the upper surface and the side surfaces of the OLED unit 234. Here, the flexible substrate 232 may be made of polyimide or any other appropriate material. The OLED unit 234 is composed of an active device array 234A and an organic light-emitting material layer 234B formed on the active device array 234A, for instance. Since the detailed structure of the OLED unit 234 is similar to that of the common OLED unit, no further description of the OLED unit 234 is provided hereinafter.

In the present embodiment, the isolation layer 236 includes a plurality of inorganic material layers 236A and a plurality of organic material layers 236B (e.g., the number of the inorganic material layers 236A is 15, and so is the organic material layers 236B), and the inorganic material layers 236A and the organic material layers 236B are alternately stacked. The inorganic material layers 236A are made of silicon nitride, silicon oxide, or any other appropriate material, for instance, and the inorganic material layers 236A are well resistant to moisture and oxygen. The satisfactory flexibility of the organic material layers 236B better precludes the inorganic material layers 236A from being cracked when the inorganic material layers 236A are being bent. The OLED device 230 further includes a circular polarization layer 238 that is disposed on the isolation layer 236, and an area of the circular polarization layer 238 is smaller than the area of the flexible substrate 232. When ambient light passes through the circular polarization layer 238 from the transparent cover 110 and is reflected by the OLED unit 234, the ambient light no longer passes through the circular polarization layer 238 again, such that a user who watches the image frames displayed by the OLED device 230 is not bothered by the ambient light. In addition, the OLED device 230 and the transparent cover 110 are adhered to each other by an adhesive layer 240, for instance.

Figure 3:
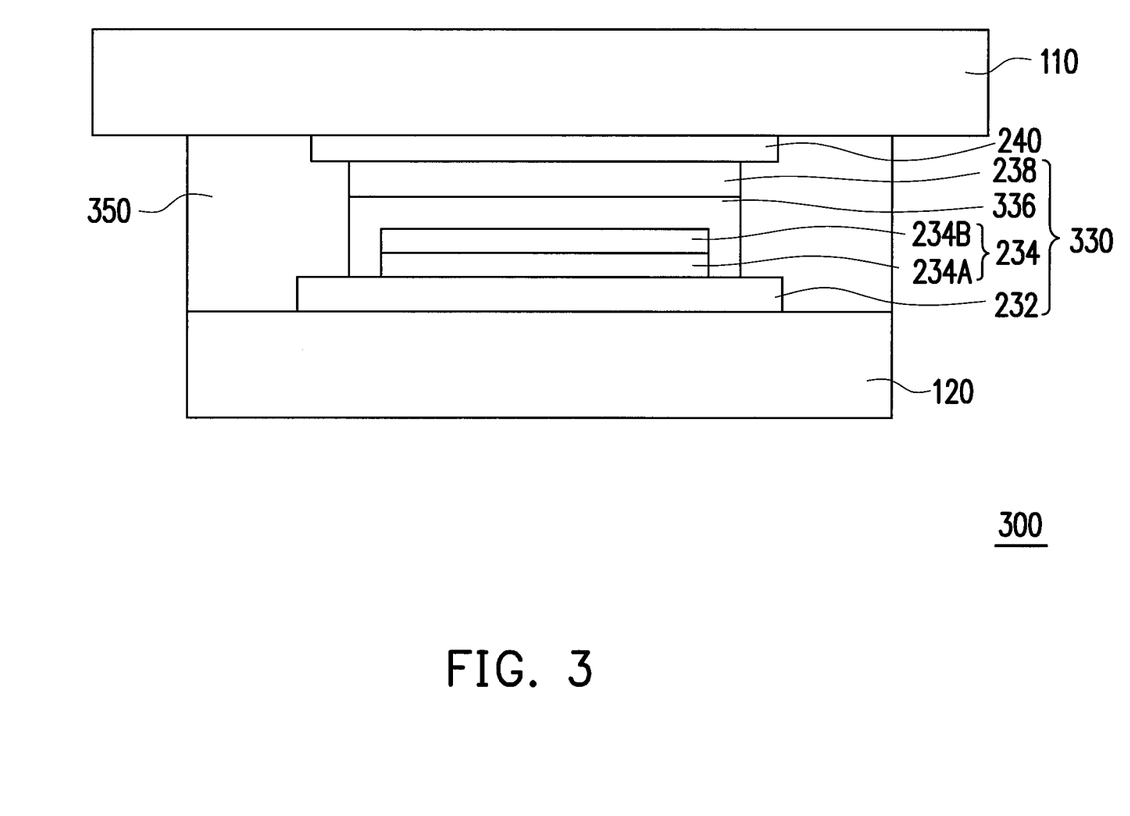

FIG. 3 is a schematic cross-sectional view illustrating a display module according to another embodiment of the invention. With reference to FIG. 3, the display module 300 described in the present embodiment is similar to the display module 200 depicted in FIG. 2, and the display module 300 may replace the display module 100 depicted in FIG. 1 and is applicable to the handheld electronic device 50 as well. In the present embodiment, the isolation layer 336 of the OLED device 330 is a single inorganic material layer. The display module 300 further includes a sealant 350 surrounding the OLED device 330, and a space between the transparent cover 110 and the first protection film 120 is filled with the sealant 350. The sealant 350 may further block moisture and oxygen and thus protect the OLED device 330 from being damaged by the moisture and oxygen.

Figure 4:
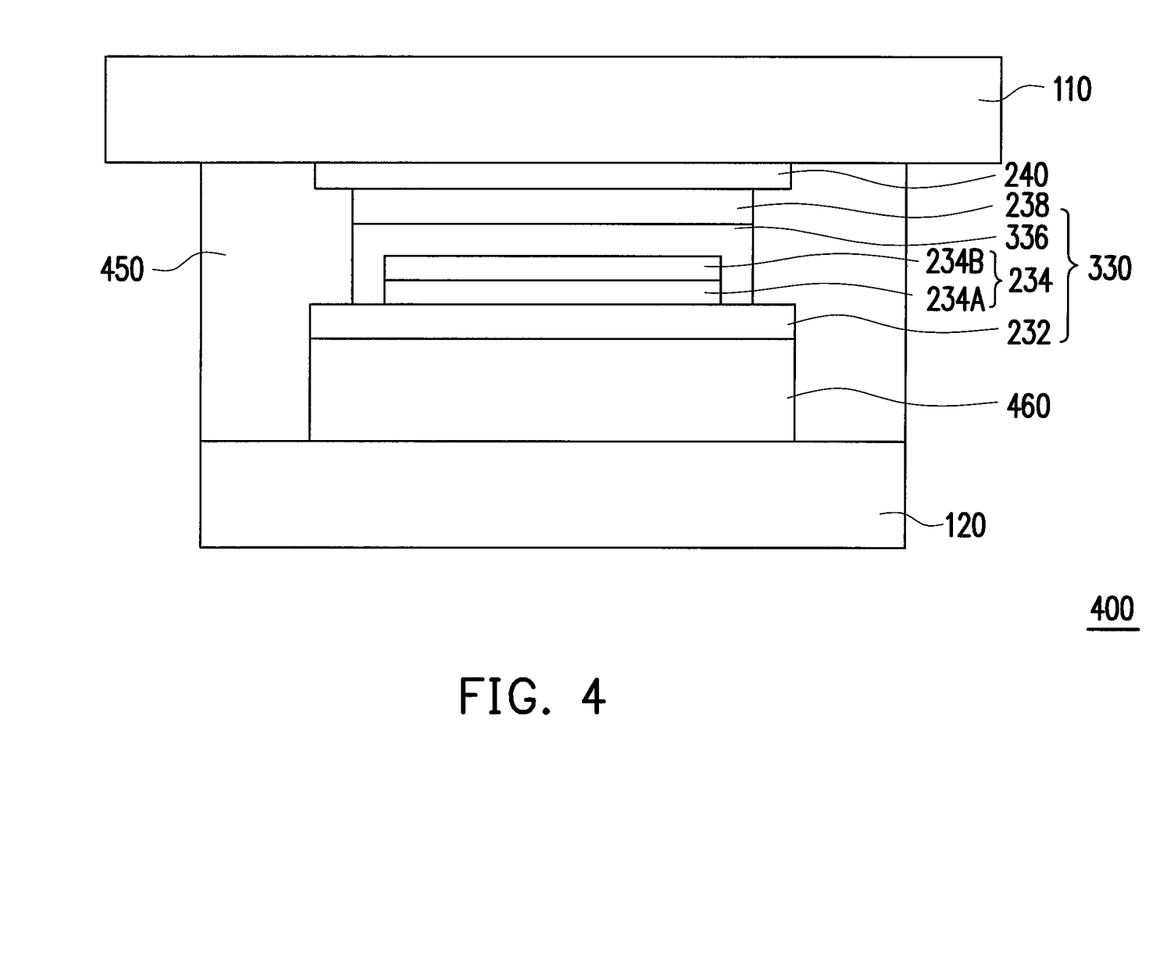

FIG. 4 is a schematic cross-sectional view illustrating a display module according to another embodiment of the invention. With reference to FIG. 4, the display module 400 described in the present embodiment is similar to the display module 300 depicted in FIG. 3, and the display module 400 may replace the display module 100 depicted in FIG. 1 and is applicable to the handheld electronic device 50 as well. In the present embodiment, the display module 400 further includes a second protection film 460 that is disposed between the flexible substrate 232 and the first protection film 120. An area of the second protection film 460 is substantially identical to the area of the flexible substrate 232 and is smaller than the area of the first protection film 120.

Figure 5:
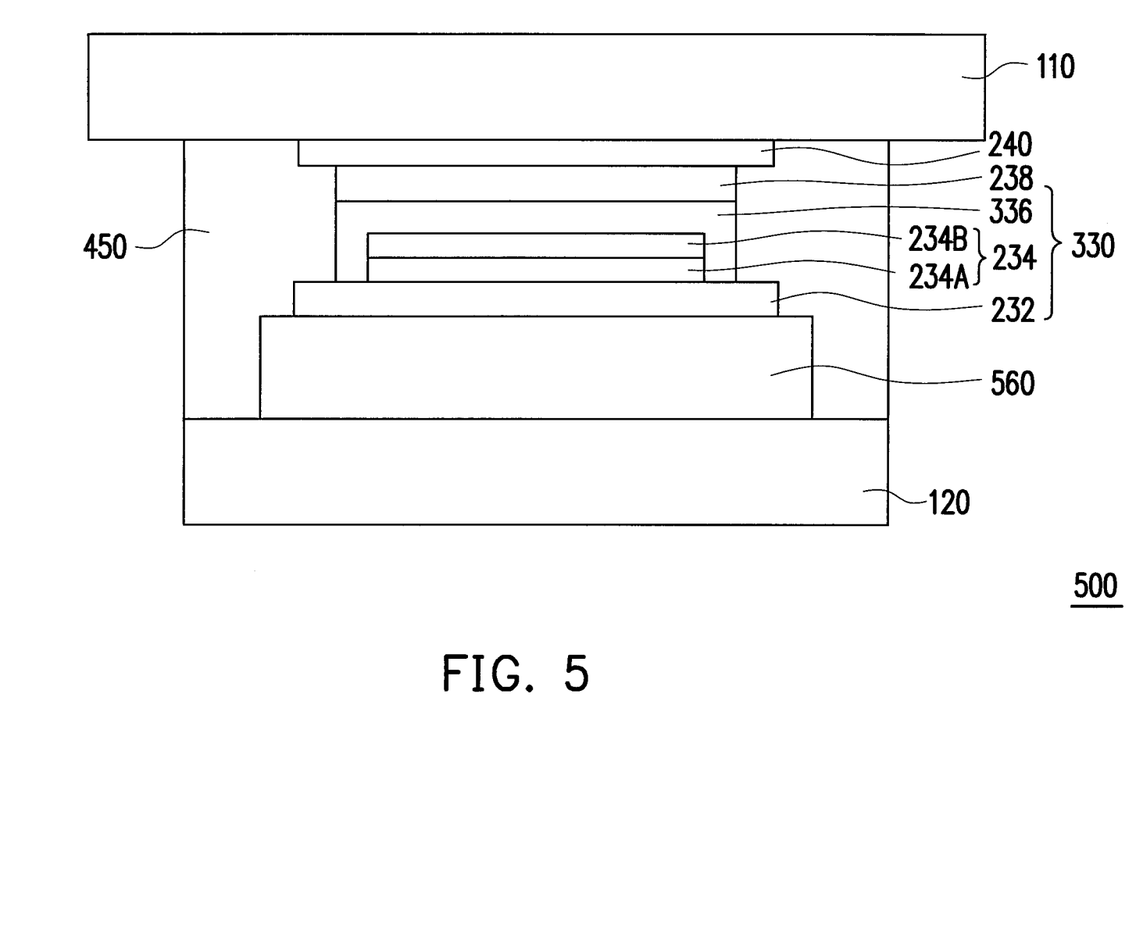

FIG. 5 is a schematic cross-sectional view illustrating a display module according to another embodiment of the invention. With reference to FIG. 5, the display module 500 described in the present embodiment is similar to the display module 400 depicted in FIG. 4, and the display module 500 may replace the display module 100 depicted in FIG. 1 and is applicable to the handheld electronic device 50 as well. In the present embodiment, the area of the second protection film 560 is greater than the area of the flexible substrate 232.

Figure 6A:
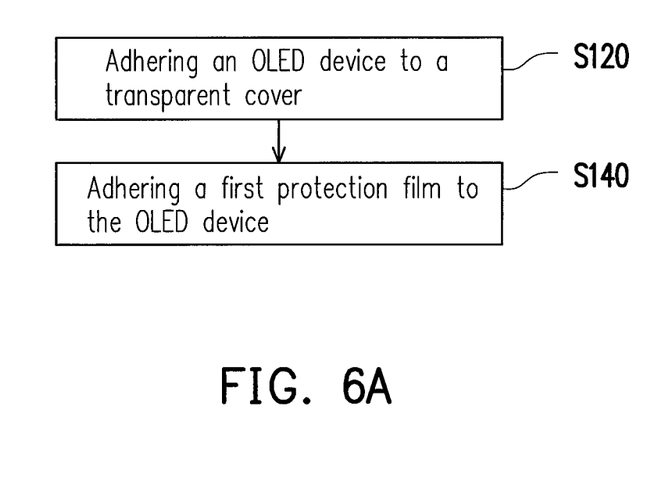
FIG. 6A is a script flowchart illustrating a fabricating method of a display module according to an embodiment of the invention.
Figure 6B:
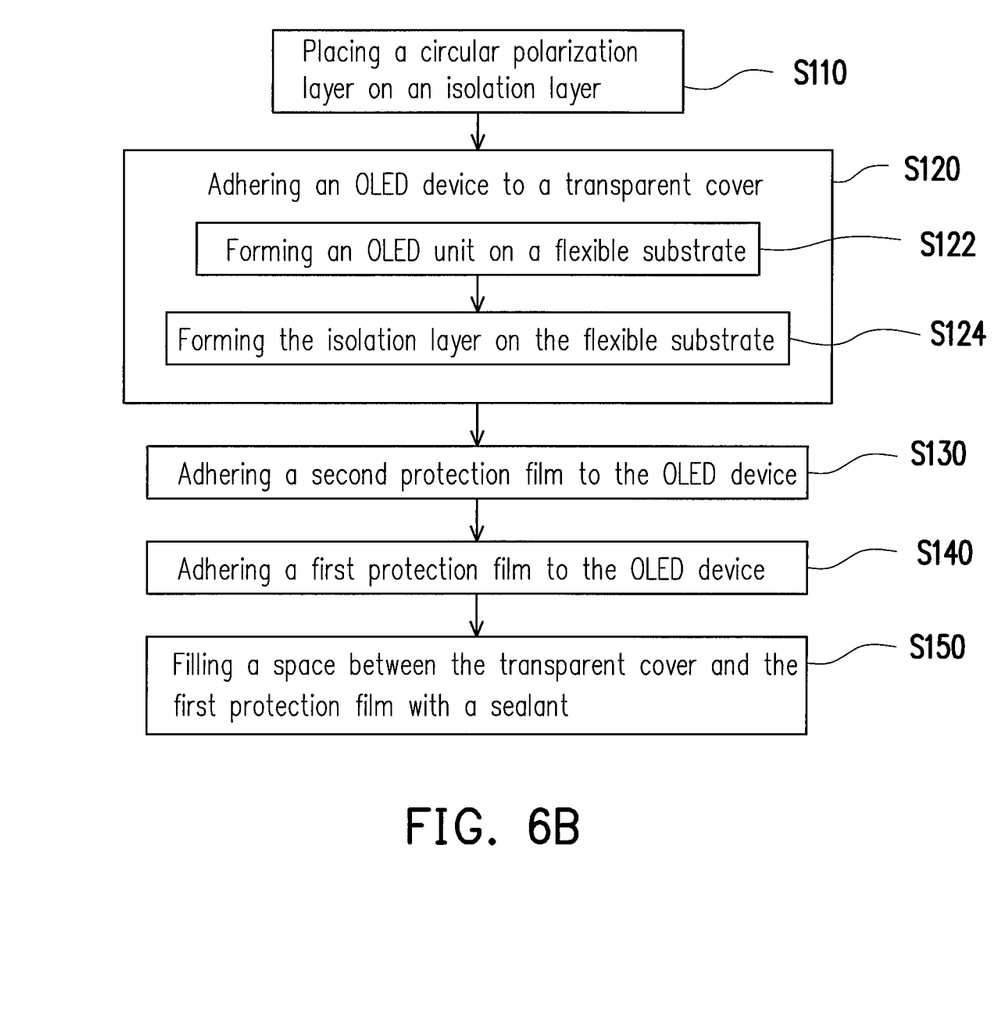
FIG. 6B is a script flowchart illustrating a modified fabricating method of the display module depicted in FIG. 6A.

FIG. 6A is a script flowchart illustrating a fabricating method of a display module according to an embodiment of the invention. FIG. 6B is a script flowchart illustrating a modified fabricating method of the display module depicted in FIG. 6A. With reference to FIG. 4 and FIG. 6A, in the fabricating method of the display module described herein, the OLED device 330 is adhered to the transparent cover 110 in step S120. The first protection film 120 is adhered to the OLED device 330 in step S140. The fabricating method of the display module described herein is completed on the same production line, which lessens the possibility of damaging the OLED device 330 during a process of transporting the OLED device 330 to the next location for assembly. The display module may be designed to have small thickness because the OLED device 330 is under the projection of the transparent cover 110 and the first protection film 120 before the OLED device leaves the production line.

With reference to FIG. 4 and FIG. 6B, the fabricating method of the display module in another embodiment is similar to that shown in FIG. 6A, while the difference between FIG. 6A and FIG. 6B is described hereinafter. Prior to the step S120, the circular polarization layer 238 may be placed on the isolation layer 336 of the OLED device 330 in step S110. Besides, in the step S120 of adhering the OLED device 330 to the transparent cover 110, the OLED unit 234 may be formed on the flexible substrate 232 in step S122. After that, the isolation layer 336 is formed on the flexible substrate 232 in step S124. The isolation layer 336 may be replaced by the isolation layer 236 depicted in FIG. 2, and thus a step of forming the inorganic material layers 236A and the organic material layers 236B is required, and the inorganic material layers 236A and the organic material layers 236B are alternatively stacked. In step S130, the second protection film 460 is adhered to the flexible substrate 232 of the OLED device 330. Additionally, in the step S140, the first protection layer 120 is adhered onto the second protection film 420. In step S150, a space between the transparent cover 110 and the first protection film 120 is filled with a sealant 450.

To sum up, in the display module and the fabricating method thereof as described herein, the cover and the protection film serve to protect the OLED device from moisture and oxygen, and thereby the manufacturing yield and the product yield may be ameliorated. From another perspective, the cover and the protection film enhance the structural strength of the display module, and accordingly the display module may have the reduced thickness and the reduced weight.

Although the invention has been described with reference to the above embodiments, it will be apparent to one of ordinary skill in the art that modifications to the described embodiments may be made without departing from the spirit of the invention. Accordingly, the scope of the invention will be defined by the attached claims and not by the above detailed descriptions.

What is claimed is:

1. An electronic device comprising:
   a body having a display opening;
   a host system disposed in the body;
   a display module placed in the display opening of the body and comprising:
      a transparent cover, being an external surface of the electronic device and being rigid;
      a first protection film; and
      an organic light-emitting display device disposed between the transparent cover and the first protection film, wherein an area of the organic light-emitting display device is smaller than an area of the transparent cover and an area of the first protection film, wherein the organic light-emitting display device comprises:
         a flexible substrate;
         an organic light-emitting display unit disposed on the flexible substrate, a distribution area of the organic light-emitting display unit being smaller than an area of the flexible substrate; and
         an isolation layer disposed on the flexible substrate, the isolation layer completely covering the organic light-emitting display unit.

2. The electronic device as recited in claim 1, wherein the display module further comprises a sealant surrounding the organic light-emitting display device, and a space between the transparent cover and the first protection film is filled with the sealant.

3. The electronic device as recited in claim 1, wherein the isolation layer is a single inorganic material layer or is comprised of a plurality of inorganic material layers and a plurality of organic material layers, and the inorganic material layers and the organic material layers are alternately stacked.

4. The electronic device as recited in claim 1, wherein the organic light-emitting display device further comprises a circular polarization layer disposed on the isolation layer, and an area of the circular polarization layer is smaller than the area of the flexible substrate.

5. The electronic device as recited in claim 1, wherein the display module further comprises a second protection film disposed between the flexible substrate and the first protection film, wherein an area of the second protection film is substantially identical to the area of the flexible substrate and is smaller than the area of the first protection film.

6. The electronic device as recited in claim 1, wherein the first protection film is a metal foil or a metal foil having a plastic substrate.

7. The electronic device as recited in claim 4, wherein the display module further comprises a sealant surrounding the organic light-emitting display device, wherein a space among the transparent cover, the first protection film, and the circular polarization layer is filled with the sealant.

8. The electronic device as recited in claim 5, wherein the display module further comprises a sealant surrounding the organic light-emitting display device, wherein a space between the transparent cover and the first protection film is filled with the sealant.

9. A fabricating method of a display module of an electronic device, wherein the electronic device comprises a body having a display opening, a host system disposed in the body and the display module placed in the display opening of the body, the fabricating method of the display module comprising:
   adhering an organic light-emitting display device to a transparent cover, wherein the transparent cover is an external surface of the electronic device and is rigid; and
   adhering a first protection film to the organic light-emitting display device, wherein the organic light-emitting display device is disposed between the transparent cover and the first protection film, and an area of the organic light-emitting display device is smaller than an area of the transparent cover and an area of the first protection film, wherein the display module is completely fabricated on the same production line and wherein a fabricating method of the organic light-emitting display device comprises:
      forming an organic light-emitting display unit on a flexible substrate, a distribution area of the organic light-emitting display unit being smaller than an area of the flexible substrate; and
      forming an isolation layer on the flexible substrate, the isolation layer completely covering the organic light-emitting display unit.

10. The fabricating method as recited in claim 9, wherein the step of forming the isolation layer comprises forming a single inorganic material layer.

11. The fabricating method as recited in claim 9, wherein the step of forming the isolation layer comprises forming a plurality of inorganic material layers and a plurality of organic material layers, and the inorganic material layers and the organic material layers are alternately stacked.

12. The fabricating method as recited in claim 9, before adhering the organic light-emitting display device to the transparent cover, the fabricating method further comprising placing a circular polarization layer on the isolation layer, wherein an area of the circular polarization layer is smaller than the area of the flexible substrate.

13. The fabricating method as recited in claim 9, before adhering the first protection film to the organic light-emitting display device, the fabricating method further comprising adhering a second protection film to the organic light-emitting display device, wherein the first protection film is adhered onto a bottom surface of the second protection film, the second protection film is disposed between the flexible substrate and the first protection film, an area of the second protection film is substantially identical to the area of the flexible substrate, and the area of the second protection film is smaller than the area of the first protection film.

14. The fabricating method as recited in claim 9, after adhering the first protection film to the organic light-emitting display device, the fabricating method further comprising filling a space between the transparent cover and the first protection film with a sealant, wherein the sealant surrounds the organic light-emitting display device.

* * * * *